US006971890B2

(12) United States Patent
Ma

(10) Patent No.: US 6,971,890 B2
(45) Date of Patent: Dec. 6, 2005

(54) LAND GRID ARRAY CONNECTOR ASSEMBLY WITH PICK UP CAP

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/894,741

(22) Filed: Jul. 19, 2004

(65) Prior Publication Data

US 2005/0014411 A1    Jan. 20, 2005

(30) Foreign Application Priority Data

Jul. 18, 2003 (TW) .............................. 92213182 U

(51) Int. Cl.[7] ............................................ H01R 13/44
(52) U.S. Cl. ........................ 439/135; 439/71; 439/940
(58) Field of Search ............................... 439/940, 331, 439/135, 70, 71

(56) References Cited

U.S. PATENT DOCUMENTS

| 5,819,404 | A | 10/1998 | Whiting | |
|---|---|---|---|---|
| 6,413,111 | B1 | 7/2002 | Pickles et al. | 439/342 |
| 6,478,558 | B2 | 11/2002 | Yamanaka et al. | |
| 6,533,592 | B1 | 3/2003 | Chen et al. | 439/135 |
| 6,547,609 | B2 | 4/2003 | Howell et al. | 439/940 |
| 6,561,825 | B1 | 5/2003 | McHugh et al. | 439/135 |
| 6,572,383 | B1 | 6/2003 | Yu | 439/41 |
| 6,753,474 | B2 * | 6/2004 | Trout | 439/940 |

* cited by examiner

Primary Examiner—Gary Paumen
(74) Attorney, Agent, or Firm—Wei Te Chung

(57) ABSTRACT

A land grid array connector assembly (10) of the present invention includes an LGA connector (12) and a pick up cap (13) attached thereon. The LGA connector includes an insulative housing (20), a plurality of electrical contacts (28) received in the housing, a metal clip (24) pivotably mounted to an end of the housing, and a lever (26) pivotably mounted to an opposite end of the housing for engaging with the clip. The clip has a generally rectangular window (240) with a plurality of inner edges (241). The pick up cap includes a flat plate (32) for being sucked by a vacuum suction device and a plurality of peripheral latches (324, 325) depending from the flat plate for snappingly engaging with the inner side edges of the window of the clip.

19 Claims, 4 Drawing Sheets

LAND GRID ARRAY CONNECTOR ASSEMBLY WITH PICK UP CAP

BACKGROUND OF THE INVENTION

1. Field of the Invention

The present invention relates to a land grid array (LGA) connector assembly which comprises an LGA connector and a pick up cap, the pick up cap being mounted to the connector for providing a flat top surface to be engaged by a vacuum suction device, whereby the LGA connector assembly can be moved onto a circuit substrate such as a printed circuit board (PCB) on which the connector is to be mounted.

2. Description of Related Art

On many production lines, electronic components such as land grid array (LGA) connectors are accurately positioned on circuit substrates such as printed circuit boards (PCBs) by means of vacuum suction devices. Such an LGA connector typically comprises an insulative housing, a plurality of electrical contacts received in the housing, a metal clip pivotably mounted to an end of the housing, and a lever pivotably mounted to an opposite end of the housing for engaging with the clip. The clip has a generally rectangular window in a middle thereof. The contacts each have first contact portions protruding outwardly from a top portion of the housing, for electrically connecting with a multiplicity of metal contact pads of an electronic package such as an LGA central processing unit (CPU). Because of this configuration of the LGA connector, a pick up cap has to be pre-attached on the top portion of the housing. The pick up cap typically has a plurality of latches snappingly engaging with corresponding outer edges of the clip, thereby mounting the pick up cap onto the LGA connector. The pick up cap has a flat top surface. The vacuum suction device is then able to engage on the flat top surface of the pick up cap, in order to reliably move and accurately position the LGA connector onto the PCB.

Referring to FIG. 4, a conventional land grid array (LGA) connector assembly 5 is illustrated. The LGA connector assembly comprises an LGA connector 51 and a pick up cap 52 attached thereon. The LGA connector 51 comprises an insulative housing 511, a plurality of electrical contacts 512 received in the housing 511, a metal stiffener 515 partly covering and reinforcing the housing 511, a metal clip 513 pivotably mounted to an end of the stiffener 515, and a lever 514 pivotably mounted to an opposite end of the stiffener 515 for engaging with the clip 513. The contacts 512 each have first contact portions protruding outwardly from a top portion of the housing 511, for electrically connecting with a multiplicity of metal contact pads of an LGA package (not shown). The pick up cap 52 has a flat plate 521 for being sucked by a vacuum suction device, and a plurality of latches 522 depending from the flat plate 521 for snappingly engaging with front edge 5130 and rear edge 5131 of the metal clip 513.

However, the front edge of the clip 513 comprises a pressed portion 5132 for being pressed by the lever 514, and the front edge 5130 beside the pressed portion 5132 is designed to downwardly slant, for forming a smooth transition therebetween. The slant front edge 5130 of the clip 513 increases difficulty and unreliability of engaging the pick up cap 52 onto the connector 51.

In view of the above, a new land grid array connector assembly with improved pick up cap which overcomes the above-mentioned disadvantages is desired.

SUMMARY OF THE INVENTION

Accordingly, an object of the present invention is to provide a land grid array connector assembly which has an LGA connector and a pick up cap mounted on the connector, wherein the pick up cap can be tightly attached onto the connector.

To achieve the above-mentioned object, a land grid array connector assembly accordance with a preferred embodiment of the present invention comprises an LGA connector and a pick up cap attached thereon. The LGA connector comprises an insulative housing, a plurality of electrical contacts received in the housing, a metal clip pivotably mounted to an end of the housing, and a lever pivotably mounted to an opposite end of the housing for engaging with the clip. The clip has a generally rectangular window with a plurality of inner edges. The pick up cap comprises a flat plate for being sucked by a vacuum suction device and a plurality of peripheral latches depending from the flat plate for snappingly engaging with the inner side edges of the window of the clip.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
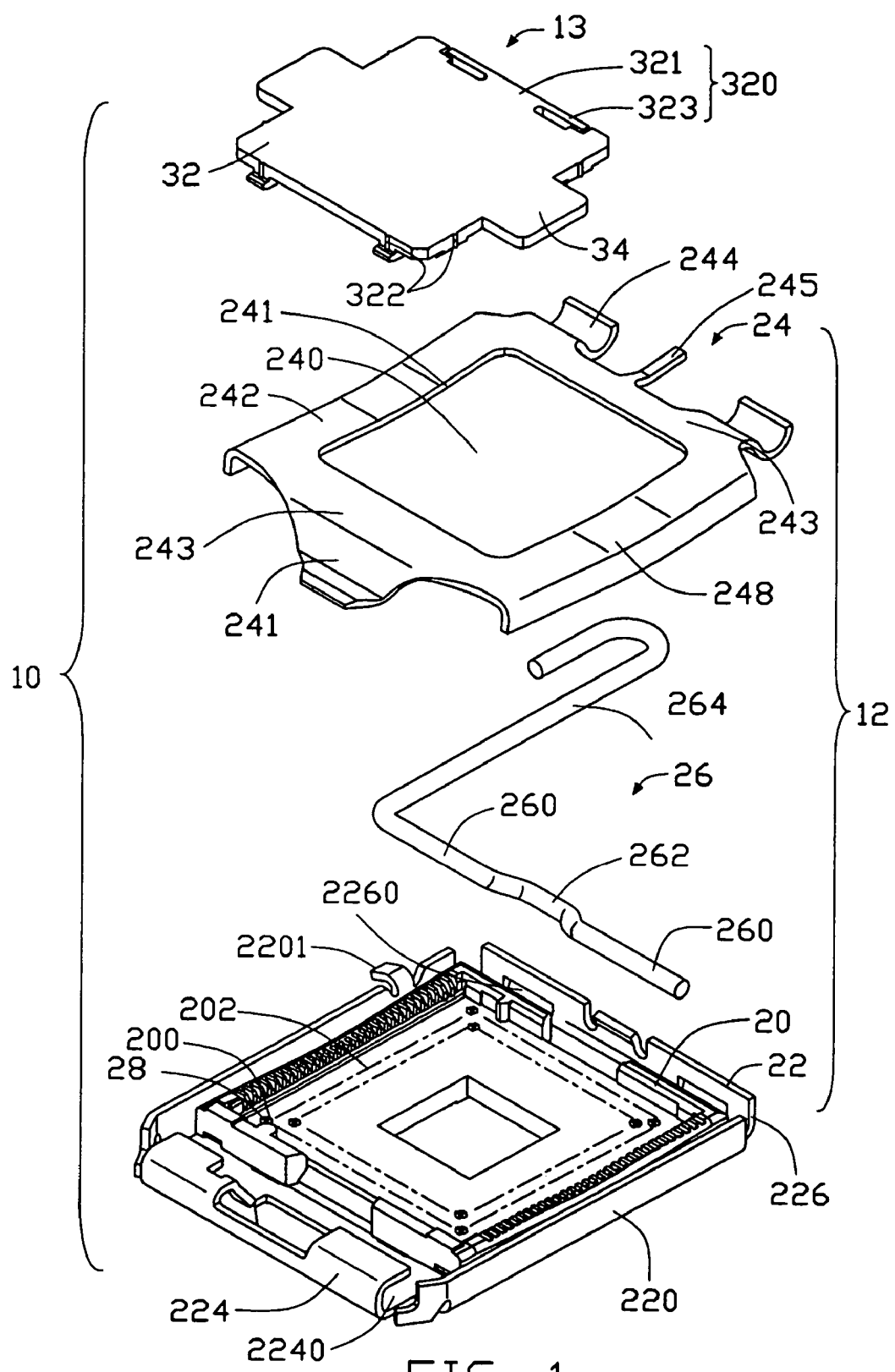
FIG. 1 is an exploded isometric view of an LGA connector assembly in accordance with the preferred embodiment of the present invention, the LGA connector assembly comprising an LGA connector and a pick up cap mounted onto the connector.

FIG. 1 is an exploded isometric view of a land grid array connector assembly 10 in accordance with a preferred embodiment of the present invention. The connector assembly 10 comprises a land grid array connector 12 and a generally rectangular pick up cap 13. The pick up cap 13 is attached onto the connector 12, for providing a flat top surface to be engaged by a vacuum suction device. The LGA connector 12 can thereby be moved onto a circuit substrate (not shown), such as a printed circuit board (PCB), on which the connector 12 is to be seated.

The connector 12 comprises a generally rectangular insulative housing 20, a plurality of contacts 28 received in the housing 20, a metal stiffener/frame 22 partly covering and reinforcing the housing 20, a metal clip 24 pivotably mounted onto an end of the stiffener 22, and a lever 26 pivotably mounted to an opposite end of the stiffener 22 for engaging with the metal clip 24.

The housing 20 defines a generally rectangular cavity 202 in a middle thereof. The cavity 202 is used for receiving an electronic package such as an LGA central processing unit (CPU) (not shown) therein. A multiplicity of passageways 200 is defined in a portion of the housing 20 under the cavity 202, the passageways 200 receiving a corresponding number of contacts 28 therein respectively.

The stiffener 22 comprises a pair of lateral sides 220 each having an L-shaped cross-section, a front end 224 having a U-shaped cross-section, and a rear end 226 having an L-shaped cross-section. The housing 21 is fittingly received in the stiffener 22. An elongate chamber 2240 is defined in the front end 224 of the stiffener 22. A pair of spaced slots 2260 is defined in the rear end 226 of the stiffener 22. An ear 2201 extends arcuately from an edge of one of the lateral sides 220 of the stiffener 22.

The lever 26 comprises a pair of locating portions 260 pivotably received in the chamber 2240 of the stiffener 22, an offset actuating portion 262 between the locating portions 260, and an operating portion 264 extending perpendicularly from an end of one of the locating portions 260. The operating portion 264 is disposed outside of the stiffener 22. When oriented at a horizontal position parallel to the top face of the housing 20, the operating portion 264 engages with the ear 2201.

The clip 24 defines a substantially plate configuration with a generally rectangular window 240 in a middle thereof, and the window 240 defines a plurality of inner edges 241. The clip 24 comprises a pair of opposite lateral sides 242 and a pair of opposite ends 243 perpendicular to the lateral sides 242. The lateral sides 242 each bend arcuately towards the housing 20 in a middle thereof, for pressing the LGA CPU in the cavity 202. The bended lateral sides therefore each form a concave area 248 thereof. The clip 24 also comprises an engaging portion 241 extending arcuately from an end thereof, a pair of spaced securing portions 244 extending arcuately from an opposite end thereof and pivotably received in the slots 2260 of the stiffener 22, and a tail 245 between the securing portions 244.

When the clip 24 is oriented at a horizontal position parallel to the top surface of the housing 20, the engaging portion 241 of the clip 24 engages with the actuating portion 262 of the lever 26 thereby pressing the CPU on the contacts 28. When the clip 24 is oriented at a position perpendicular to the top face of the housing 20, the tail 245 abuts against the stiffener 22 to prevent the clip 24 from being over-rotated.

Figure 2:
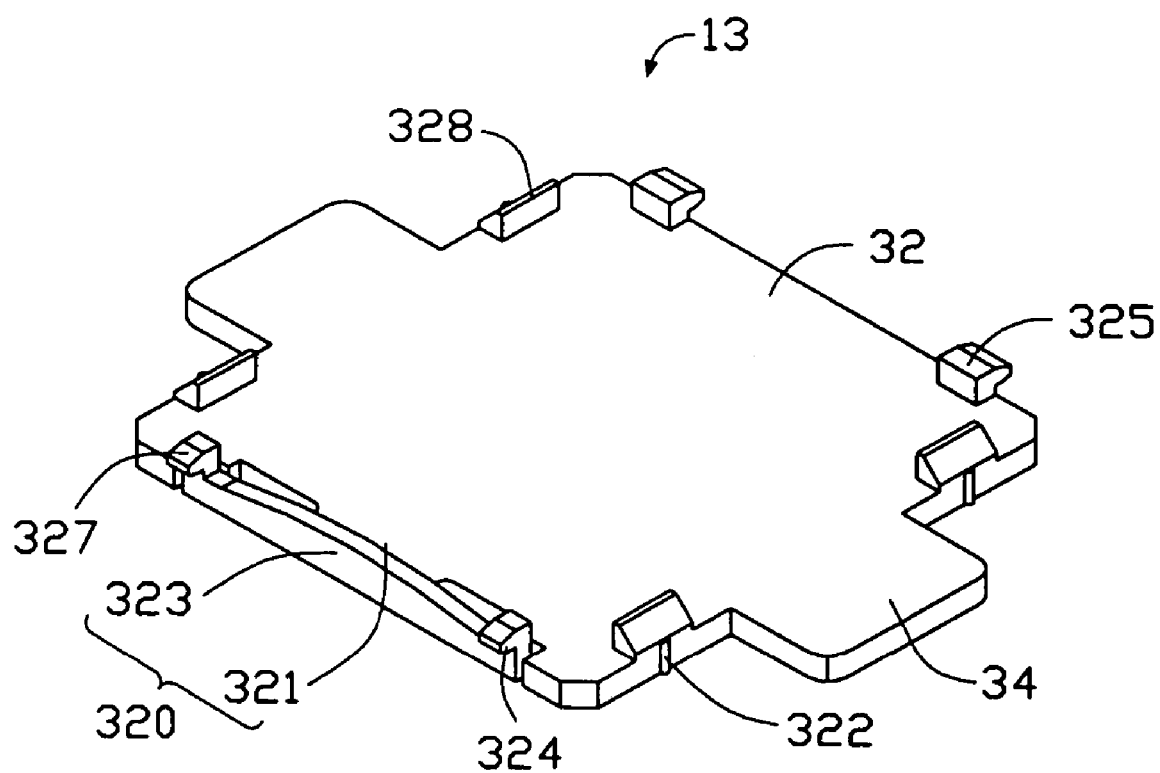
FIG. 2 is an isometric view of the pick up cap, but showing the pick up cap inverted.

Referring also to FIG 2, the pick up cap 13 comprises a substantially rectangular flat plate 32 with a pair of opposite lateral sides and a pair of ends perpendicular to the lateral sides. A pair of latches 324, 325 depends form each lateral side of the flat plate 32 respectively for snappingly engaging with the inner edges 241 of the metal clip 24. A pair of extending portions 34 extends from two opposite ends of the flat plate 32. One of the lateral sides defines a T shaped deforming portion 320, and the deforming portion 320 comprises a connecting portion 321 and a beam 323 perpendicular to the connecting portion 321. The connecting portion 321 connects the beam 323 in a middle thereof, and therefore the connecting portion 321 and the beam 323 cooperatively forms the T shaped deforming portion 320. A pair of first latches 324 extends downwardly from the beam 323, and a pair of second latches 325 extends from the lateral side opposite to the deforming portion 320. The first and second latches 324, 325 each define a clasp 327 for mounting the pick up cap 13 onto the clip 24. Each edge of flat plate 32 has a plurality of protrusions 322 extending outwardly and laterally for engaging with a corresponding inner edge 241 of the window 240. Two pairs of guiding portions 328 are defined on a surface of the flat plate 32, in communication with the edges of the opposite ends, for facilitating attachment of the pick up cap 13 onto the connector 12.

Figure 3:
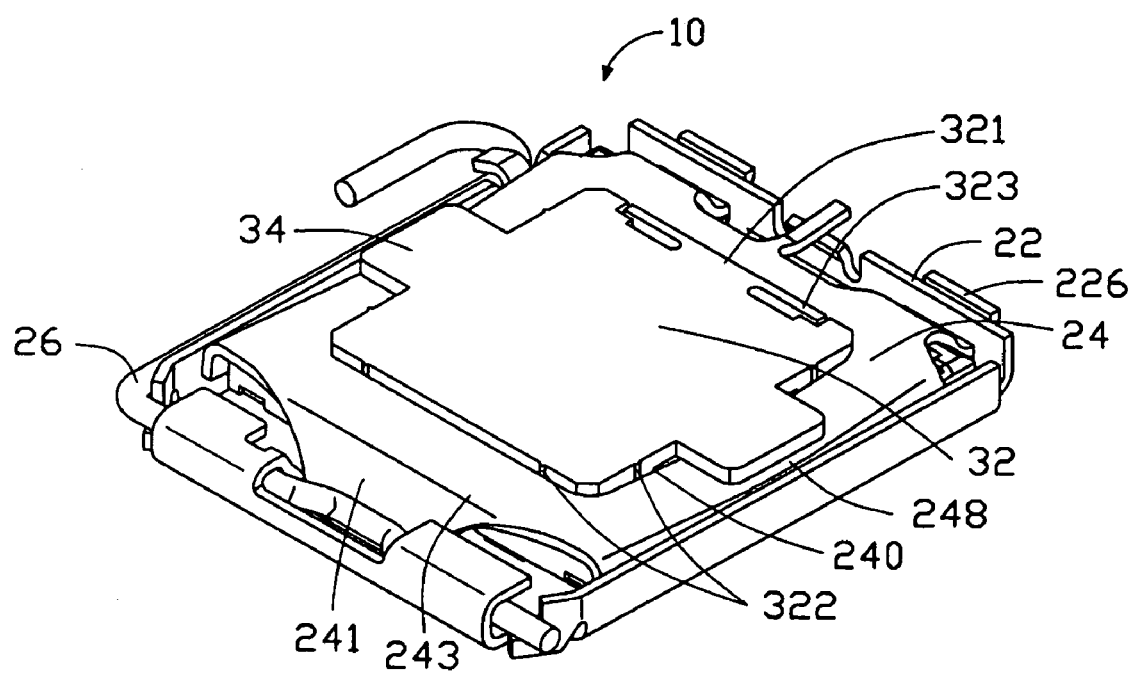
FIG. 3 is an assembled isometric view of the pick up cap and the connector of FIG. 1.
Figure 4:
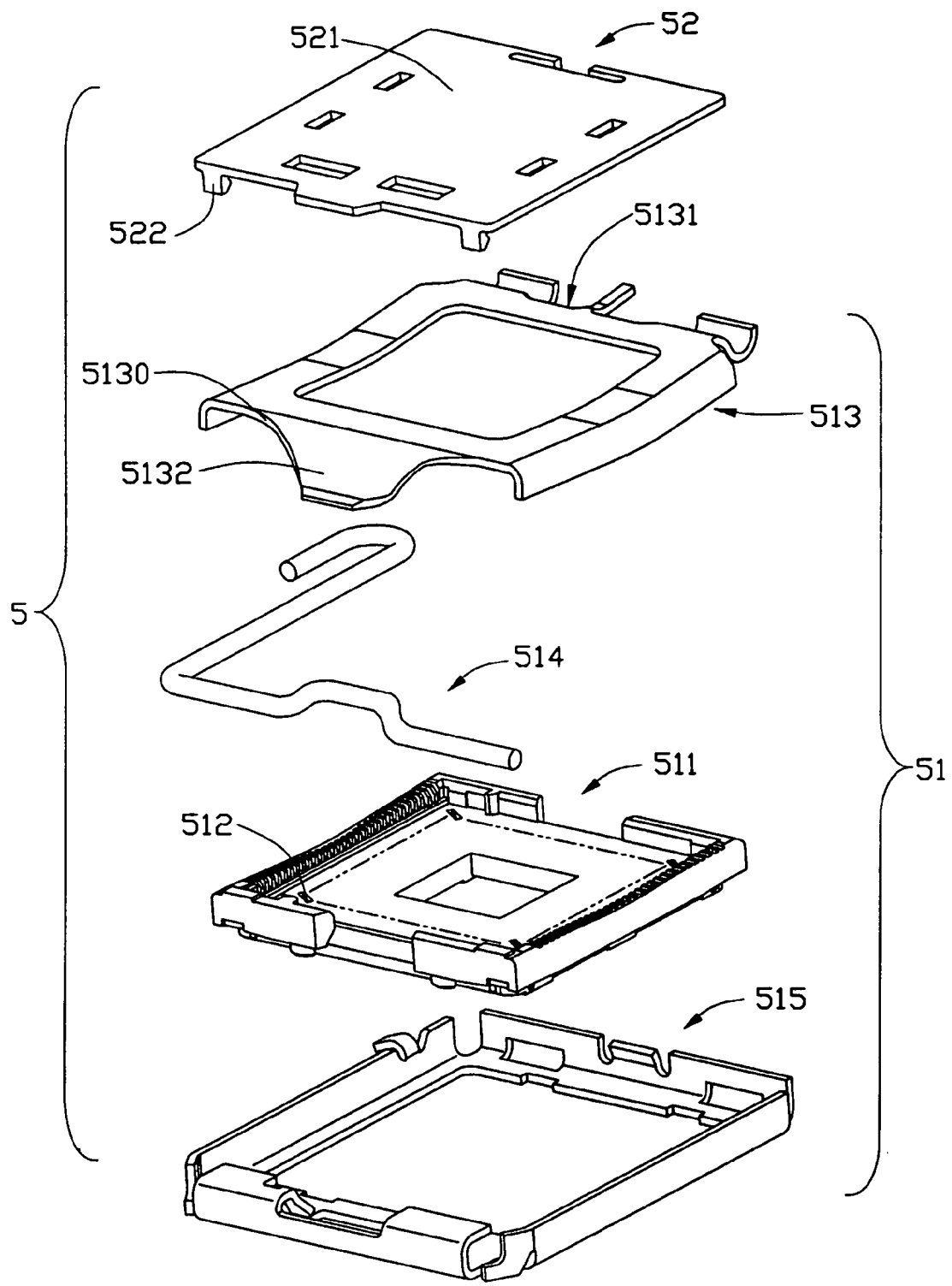
FIG. 4 is an exploded isometric view of a conventional LGA connector assembly, showing a conventional pick up cap ready to be mounted onto a clip.

Referring to FIG 3, in attaching the pick up cap 13 onto the connector 12, the pick up cap 13 is disposed over the connector 2, with the second latches 325 loosely clasping to a corresponding inner edge 241 of the window 240 and the first latches 324 loosely contacting with the opposite inner edge. Then pressing down the pick up cap 13, the first latches 324 abut against the corresponding inner edge of the window 240. The first latches 324 elastically deflect inwardly. When the first latches 324 snappingly clasp the edges of the window 240, and the protrusions 322 abut against the corresponding edge of the window 240, the pick up cap 13 is thereby securely mounted onto the connector 12. Furthermore, the extending portion 34 of the pick up cap 13 is attached onto corresponding concave area 248 of the clip 24, preventing the whole pick up cap 13 from going through the window 240. In this position, a vacuum suction device (not shown) can engage the top surface of the pick up cap 13 for moving the connector assembly 1 to a desired location on the PCB.

As appreciated from the foregoing description, the pick up cap 13 engages with the inner edges 241 of the clip 24. Therefore, the attachment of the pick up cap 13 onto the clip is reliable, even if the clip defines a slant front edge. Furthermore, the concave 248 of the lateral side 242 can receive the extending portion 34 of the pick up cap 13, therefore low profile of the connector assembly is also achieved.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array connector assembly, the connector assembly comprising:

a land grid array connector comprising an insulative housing defining a cavity for receiving an electronic package therein, a plurality of electrical contacts received in a portion of the housing under the cavity, a clip attached on the housing to press the electronic package upon the contacts, the clip defining a substantially rectangular window with four inner edges;

a pick up cap mounted on the clip, the pick up cap defining a plurality of latches for engaging with the inner edges of the clip, thereby attaching the pick up cap onto the clip.

2. The land grid array connector assembly as claimed in claim 1, wherein the pick up cap comprises a generally rectangular flat plate with two opposite lateral sides and two opposite ends, and the window is generally rectangular corresponding to the pick up cap.

3. The land grid array connector assembly as claimed in claim 2, wherein one lateral side of the pick up cap defines a deforming portion comprising a connecting portion and a beam perpendicular to the connecting portion.

4. The land grid array connector assembly as claimed in claim 3, wherein the beam defines a pair of first latches depending downwardly thereof towards the land grid array connector.

5. The land grid array connector assembly as claimed in claim 4, wherein the lateral side opposite to the deforming portion defines a pair of second latches.

6. The land grid array connector assembly as claimed in claim 5, wherein two opposite ends of the pick up cap each define an extending portion.

7. The land grid array connector assembly as claimed in claim 6, wherein the edges of the pick up cap define a plurality of protrusions for engaging with corresponding inner edges of the window.

8. The land grid array connector assembly as claimed in claim 6, wherein the clip comprises a pair of lateral sides each defining a concave for receiving the extending portion of the pick up cap.

9. A land grid array connector assembly comprising:
- an insulative housing subassembly defining a cavity for receiving an electronic package therein;
- a plurality of contacts located mainly under the cavity for mechanically and electrically connecting the electronic package;
- a clip moveable relative to the housing subassembly for allowing insertion of the electronic package in the cavity when said clip is in an open position or sealing of the electronic package in the cavity when said clip is in a closed position, the clip comprises a rectangular window in a middle;
- a pick up cap attached onto the clip, the pick up cap defining a plurality of latches for engaging with the inner edges of the clip, thereby attaching the pick up cap onto the clip.

10. The land grid array connector assembly as claimed in claim 9, wherein the pick up cap comprises a generally rectangular flat plate with two opposite lateral sides and two opposite ends, and the window is generally rectangular corresponding to the pick up cap.

11. The land grid array connector assembly as claimed in claim 10, wherein one lateral side of the pick up cap defines a deforming portion, and the deforming portion comprises a connecting portion and a beam perpendicular to the connecting portion.

12. The land grid array connector assembly as claimed in claim 11, wherein the beam defines a pair of first latches depending downwardly thereof towards the land grid array connector.

13. The land grid array connector assembly as claimed in claim 12, wherein the lateral side opposite to the deforming portion defines a pair of second latches.

14. The land grid array connector assembly as claimed in claim 13, wherein two opposite ends of the pick up cap each define an extending portion.

15. The land grid array connector assembly as claimed in claim 14, wherein the edges of the pick up cap define a plurality of protrusions for engaging with corresponding inner edges of the window.

16. The land grid array connector assembly as claimed in claim 14, wherein the clip comprises a pair of lateral sides each defining a concave for receiving the extending portion of the pick up cap.

17. An LGA connector assembly, comprising:
- an LGA connector, comprising:
- an insulative housing for receiving an electronic package in a cavity therein;
- a clip disposed on the housing;
- a pick up cap mounted on the clip, the pick up cap defining a plurality of first latches located on a first side edge along a first direction for mounting to the clip and a finger operation portion located on a second side edge along a second direction perpendicular to said first direction while extending along said first direction.

18. The assembly as claimed in claim 17, wherein a plurality of second latches is located on a third side along the first direction.

19. The assembly as claimed in claim 18, wherein the first latches are flexible.

* * * * *